(12) United States Patent
Cina et al.

(10) Patent No.: US 9,496,499 B2
(45) Date of Patent: Nov. 15, 2016

(54) ORGANIC LIGHT-EMITTING DIODE WITH DOPED LAYERS

(75) Inventors: Salvatore Cina, Grenoble (FR); Henri Doyeux, Beaucroissant (FR); David Vaufrey, Rennes (FR); Armand Bettinelli, Coublevie (FR)

(73) Assignee: COMMISSARIAT A L'ENERGIE ATOMIQUE, Paris (FR)

( * ) Notice: Subject to any disclaimer, the term of this patent is extended or adjusted under 35 U.S.C. 154(b) by 1830 days.

(21) Appl. No.: 11/884,837

(22) PCT Filed: Feb. 21, 2006

(86) PCT No.: PCT/EP2006/060157
§ 371 (c)(1),
(2), (4) Date: Oct. 19, 2007

(87) PCT Pub. No.: WO2006/089901
PCT Pub. Date: Aug. 31, 2006

(65) Prior Publication Data
US 2008/0160341 A1    Jul. 3, 2008

(30) Foreign Application Priority Data
Feb. 22, 2005   (FR) .................................... 05 50490

(51) Int. Cl.
*H01L 51/00* (2006.01)
*H01L 51/50* (2006.01)

(52) U.S. Cl.
CPC ......... *H01L 51/002* (2013.01); *H01L 51/5052* (2013.01); *H01L 51/5092* (2013.01); *H01L 51/0026* (2013.01)

(58) Field of Classification Search
USPC .......................................................... 427/64
See application file for complete search history.

(56) References Cited

U.S. PATENT DOCUMENTS

| 6,013,384 | A | 1/2000 | Kido et al. | |
| 6,509,109 | B1* | 1/2003 | Nakamura et al. | 428/690 |
| 6,541,909 | B1* | 4/2003 | Motomatsu | 313/504 |
| 6,641,859 | B1* | 11/2003 | Long et al. | 427/66 |
| 6,821,649 | B2 | 11/2004 | Kambe et al. | |

(Continued)

FOREIGN PATENT DOCUMENTS

| EP | 0 498 979 A1 | 8/1992 |
| EP | 0 949 696 A2 | 10/1999 |

(Continued)

OTHER PUBLICATIONS

Kim et al., "Effect of Thermal annealing on the lifetime of polymer light-emitting diodes," Appl. Phys. Letters 82, 24, pp. 4238-4240, 2003.*

(Continued)

*Primary Examiner* — Robert Vetere
(74) *Attorney, Agent, or Firm* — Oliff PLC

(57) ABSTRACT

The invention concerns an organic light-emitting diode comprising a lower electrode (2) and an upper electrode (8), an electroluminescent organic layer (5), and at least one doped organic layer (3; 7) in contact with one of said electrodes. The invention is characterized in that the doping is carried out using an alkaline-earth element or lanthanide, and the diode is heat-treated at temperature preferably not less than 60° C. for more than one hour. The invention enables the lighting performance of the diode to be considerably improved.

14 Claims, 7 Drawing Sheets

(56) References Cited

U.S. PATENT DOCUMENTS

| | | | |
|---|---|---|---|
| 7,030,554 B2* | 4/2006 | Liao et al. | 313/504 |
| 2001/0026846 A1* | 10/2001 | Yamazaki et al. | 427/535 |
| 2002/0028347 A1* | 3/2002 | Marrocco, III | C08G 61/10 428/690 |
| 2002/0055015 A1 | 5/2002 | Sato et al. | |
| 2002/0164416 A1 | 11/2002 | Yamazaki | |
| 2003/0072967 A1 | 4/2003 | Kido et al. | |
| 2003/0132704 A1* | 7/2003 | Aziz et al. | 313/506 |
| 2003/0143428 A1 | 7/2003 | Kim et al. | |
| 2004/0033641 A1 | 2/2004 | Yang et al. | |
| 2004/0265630 A1* | 12/2004 | Suh et al. | 428/690 |
| 2005/0173700 A1* | 8/2005 | Liao et al. | 257/40 |

FOREIGN PATENT DOCUMENTS

| | | |
|---|---|---|
| EP | 0 977 288 A2 | 2/2000 |
| EP | 0977288 * | 2/2000 |
| JP | A 10-270171 | 10/1998 |

OTHER PUBLICATIONS

Lee et al., "Improvement of EL efficiency in polymer light-emitting diodes by heat treatments," 2001, Synth. Met. 117, pp. 249-251.*

Kido, J., "Bright Organic Electroluminescent Devices Having a Metal-Doped Electron-Injecting Layer," *Applied Physics Letters*, vol. 73, No. 20, pp. 2866-2868 (1998).

Kim, J., "Effect of Thermal Annealing on the Lifetime of Polymer Light-Emitting Diodes," *Applied Physics Letters*, vol. 82, No. 24, pp. 4238-4240 (2003).

Michaelson, H.B., "The Work Function of the Elements and its Periodicity," *Journal of Applied Physics*, vol. 48, No. 11, pp. 4729-4733 (1977).

Patel, N.K., "High-Efficiency Organic Light-Emitting Diodes," *IEEE Journal of Selected Topics in Quantum Electronics*, vol. 8, No. 8, pp. 346-361 (2002).

* cited by examiner

ORGANIC LIGHT-EMITTING DIODE WITH DOPED LAYERS

BACKGROUND OF THE INVENTION

The invention concerns an organic light-emitting diode comprising:
- a substrate,
- a lower electrode of a first kind on the substrate side and an upper electrode of a second kind opposite the substrate, the kinds of electrodes corresponding to anode and cathode,
- a light-emitting organic layer which is intercalated between the lower electrode and the upper electrode,
- and a doped organic layer in contact with said cathode, which is intercalated between this cathode and said light-emitting layer and which is doped with a donor dopant.

The invention also relates to lighting or image display panels comprising an array of these diodes sharing the same substrate.

STATE OF THE ART

As disclosed by the document EP0498979—TOSHIBA— see page 2, such a doped organic layer enables the electric charges to be injected and transported between the electrode in contact with which it is and the light-emitting layer, with a much lower electric resistance than by using a non-doped organic injection layer and a non-doped organic transport layer. The supply voltage of diodes of this type is then substantially lowered and their lighting efficiency is improved. The advantage of using doped organic layers to inject and transport charge, electrons or holes in the light-emitting layer, instead of charge injection and transport layers of the prior art, is twofold. In fact, both the following are obtained:
- a reduction of the charge injection barrier,
- and a reduction of the ohmic losses in the charge injection and transport layers, since these layers present a high conductivity due to the doping.

To give the required electric characteristics to the organic materials used for the electron injection and transport layers between the electrode acting as cathode and the light-emitting layer, organic or inorganic doping elements are used that are suitable to create energy levels called donors in the vicinity of the Lowest Unoccupied Molecular Orbital (LUMO) of this material.

In the case of a layer of doped organic material which is in contact with an electrode acting as cathode which is intercalated between this cathode and the light-emitting layer and which is therefore doped with a donor, the document U.S. Pat. No. 6,013,384 describes the use of different organic materials including bathophenanthroline (="Bphen"), and the use of different dopants including alkaline earth elements such as calcium. The thickness of the doped organic layer is comprised between 1 and 300 nm, and concentrations greater than 0.1% in weight are recommended, for example 1.4% in weight. The document U.S. Pat. No. 6,013,384 discloses that the relation between doping and the reduction of the height of the electronic barrier in contact with the electrode results from oxidation reduction reactions between the "host" material and the dopant.

The document U.S. Pat. No. 6,821,649—TDK, which also proposes a solution to lower the potential barrier between the cathode and the light-emitting layer of a diode, itself quotes the document JP10-270171 which describes the use of lithium-doped or magnesium-doped tri(8-quinolino-lato)aluminium (="Alq3"), or of lithium-doped batho-phenanthroline (="Bphen") for this doped organic layer in contact with the cathode.

The document US2002-055015 also describes (§59-60) the use of bathophenanthroline (="Bphen") doped with an alkaline element for the electron injection and transport layers.

For doping of the organic materials of this electron injection and/or transport layer, it is therefore known to use an alkaline element or an alkaline earth element. From the diode performance point of view, the alkaline element is preferred; but the alkaline element is difficult to deposit without it combining, in particular with one or the other of the basic organic components of the layer, to form organometallic components. The alkaline earth element is easier to introduce into the material than the alkaline element, as it evaporates less easily when deposited, but its doping effect seemed up to now to be lesser, in that it lowers the potential barrier between the light-emitting organic layer and the cathode less than an alkaline element, and that the improvement of lifetime it procures is less than that procured by doping by an alkaline element.

OBJECT OF THE INVENTION

One object of the invention is to obtain both of the advantages at the same time:
- ease of introducing the dopant into the organic material of the layer in contact with the cathode,
- large lowering of the potential barrier and improvement of the diode lifetime.

For this purpose, one object of the invention is to provide a method for producing an organic light-emitting diode comprising the following steps:
- deposition of a lower electrode of a first kind on a substrate,
- deposition of an organic light-emitting layer on said lower electrode,
- deposition of an upper electrode of a second kind on said organic light-emitting layer, the kinds of electrodes corresponding to anode and cathode,
and, between said cathode and said light-emitting organic layer, deposition of a layer of organic material that is doped with a donor in contact with said cathode,
the donor being selected from the group comprising the elements presenting a work function lower than 4 eV,
said method also comprising, after said deposition steps, a thermal treatment step of the substrate coated with said electrodes and said layers.

The article entitled "The work function of the elements and its periodicity" by Herbert B. Michaelson, of the IBM Corporation, published on Nov. 11, 1977 in pages 4729 to 4733 in Journal of Applied Physics, Vol. 48, No11, indicates the work function values for different elements of Mendeleev's classification table. This article therefore enables the man skilled in the trade to determine elements which present a work function lower than 4 eV.

Preferably the temperature of said thermal treatment is greater than or equal to 60° C. Preferably the duration of said thermal treatment is greater than or equal to 1 hour. A significant improvement of the efficiency of doping of said doped organic layer by the doping element is thus obtained.

It is a further object of the invention to provide a light-emitting diode that is able to be obtained by the method according to the invention, characterized in that the donor is selected from the group formed by the alkaline earth elements and lanthanides. In the above-mentioned article by Herbert B. Michaelson, it can be seen that alkaline earth elements and lanthanides (from cerium to lutecium) present a work function lower than 4 eV.

Preferably the donor is selected from the group formed by alkaline earth elements.

Preferably the donor is selected from the group formed by magnesium and calcium. Advantageously, these elements are easier to vacuum deposit, as they sublimate in a vacuum.

Preferably, the organic material that is doped with a donor is selected from the group formed by polycyclic compounds such as p-terphenyl, quaterphenyl, and derivatives thereof, polycyclic hydrocarbon condensation compounds such as naphthalene, pentacene, tetracene, pyrene, coronene, chrysene, anthracene, diphenylanthracene, naphtacene, phenanthrene, and derivatives thereof, heterocyclic condensation compounds such as phenanthroline, bathophenanthroline, phenanthridine, acridine, quinoline, quinoxaline, phenazine, and equivalent products and their derivatives, and fluorocein, perylene, phtaloperylene, naphtaloperylene, perynone, phtaloperynone, naphtaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyran, thiopyran, polymethine, merocynanine, quinacridine, rubrene, and derivatives thereof.

Preferably, the organic material that is doped with a donor is bathophenanthroline-based.

Numerous examples of bathophenanthrolines are given in the document EP1097980; the common abbreviated name of this product is Bphen. It has been observed that, among the organic materials that are able to be doped with donors and to be used for the doped organic layer of the diode according to the invention, it is with Bphen that the best doping efficiency is obtained after thermal treatment.

Preferably, the doping level of dopant of said doped organic layer is higher at the interface of this layer with the cathode than at the heart of this doped organic layer.

Due to a different doping level at the interface with the cathode and in the heart of the doped organic layer, both the thickness of the potential barrier at the interface can be reduced and the electric resistance at the heart of the material be increased as the doping level is lower, which enables both the electron injection properties and transport properties of this doped layer to be optimized. Preferably a potential barrier greater than 0.2 eV exists at said interface. At room temperature, this interface therefore forms a Schottky junction.

If the cathode material that is at the interface with the doped organic layer according to the invention is a metal that presents a work function $E_{M1}$, and if the material O1 of said organic layer n-doped with donors at this interface presents a Fermi level $E_1$ and a LUMO level $E_{C1}$, then we have $|E_{C1}-E_{M1}|>0.2$ eV and $E_{M1}>E_1$ (the reverse condition $E_{M1}<E_1$ would on the contrary imply an ohmic contact). The electron injection mechanism at this interface is then the following: the electrons that populate the "donor" levels near this interface pass into the metal M1 which is an infinite reservoir of charges, and depopulation of the "donor" levels in the semi-conducting organic material O1 near this interface gives rise to a positive local charge which forms a potential barrier at the interface, and the level $E_{C1}$ of the LUMO then presents a curvature near this interface. The thickness of the barrier which corresponds to the extent of this curvature is in the region of a few nanometers. When a potential difference is applied to the diode in the turn-on direction to emit light, the electrons pass through this barrier by tunnel effect.

More generally, the Fermi level energy $E_1$ and that $E_{V1}$ of the Highest Occupied Molecular Orbital (HOMO) level can also be defined for the doped organic material O1. The n-doping donor level of this material is expressed by the relation: $E_1-E_{C1}<E_{V1}-E_1$.

Preferably, the diode comprises an organic hole restraining layer intercalated between said doped organic layer and said light-emitting layer. The thickness of this layer is preferably greater than or equal to 5 nm. The base material of the hole restraining layer can be of the same nature as the base material of the doped organic layer, but without being doped with a donor. In the case where thermal treatment according to the invention makes the donor migrate into this restraining layer, the conditions of initial thickness of this layer and of thermal treatment are preferably adapted so that the thickness of the restraining layer non-doped with donor remains greater than or equal to 5 nm. The document US2002-055015 describes (example 1) a diode comprising a sodium-doped bathophenanthroline-base electron transport layer, but not comprising any hole restraining layer made of non-doped material intercalated between the light-emitting layer and the donor-doped electron transport layer. This document discloses (§106) that after 96 hours at 60° C., the light-emitting characteristics of the diode remain "practically acceptable", which means that they are not significantly improved, on the contrary. According to the invention, the improvement of the performances of the diodes is greater when the diode comprises a hole restraining layer made from a material that is not doped with donor, which layer is intercalated between the light-emitting layer and the layer doped with donor for electron transport. This improvement is also greater when an alkaline earth element or a rare earth is used rather than sodium as donor in the doped layer of the diode.

Such restraining layers are described in the document EP1017118—SHARP. Such restraining layers serve the purpose of limiting electron-hole recombinations outside the light-emitting layer so as to maintain a high lighting efficiency. Such restraining layers are particularly useful when the light-emitting layer comprises phosphorescent dopants which enable radiative recombination of the electron-hole excitrons called "triplets", as these excitrons have a lifetime that enables them to diffuse over several hundred nanometers, which makes restraining of the electrons or of the holes all the more useful to prevent non-radiative recombinations. Reference should for example be made to the article entitled "High-Efficiency Organic Light-Emitting Diodes" by N. K. Patel, S. Cina and J. H. Burroughes in "IEEE Journal on selected topics in quantum electronics", Vol. 8, No. 2, March-April 2002, pp. 346-361, which describes the importance of triplets and of phosphorescent dopants to improve the lighting efficiency of organic light-emitting diodes.

A further object of the invention is to provide a lighting or image display panel comprising an array of diodes according to the invention where the diodes of this array are supported by the same substrate.

Preferably said substrate is an active matrix comprising an array of control and power supply circuits.

Preferably the lower electrodes of these diodes are cathodes—each control and power supply circuit corresponds to a diode of the panel and then comprises an n-type current-modulating transistor which is connected in series with this diode. Combination of this structure called "reverse" and of an n-type modulating transistor enables it to be ensured that each transistor commands a diode regardless of the voltage drop at the terminals of this diode.

Preferably the substrate comprises a layer of semi-conducting material made from amorphous silicon. Each modulating transistor then comprises a portion of this silicon layer.

BRIEF DESCRIPTION OF THE DRAWINGS

The invention will be better understood on reading the following description, given as a non-restrictive example only, and with reference to the accompanying drawings, in which.

DESCRIPTION OF A PREFERRED EMBODIMENT

Figure 1:
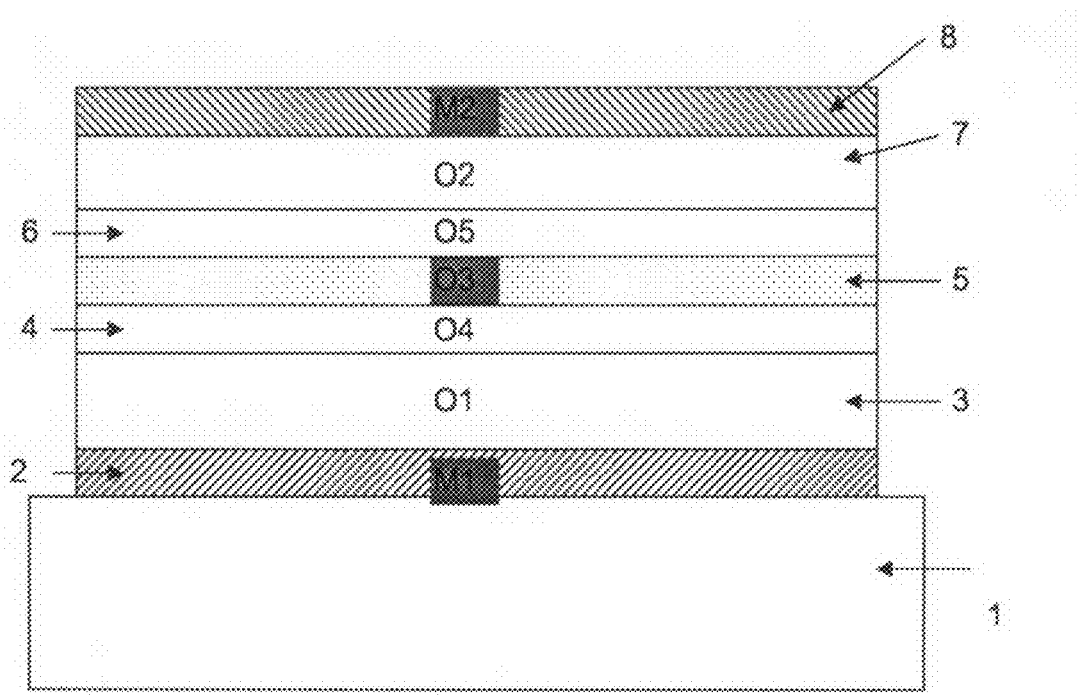
FIG. 1 illustrates an embodiment of a diode according to the invention.

Production of a diode according to an embodiment of the invention will now be described with reference to FIG. 1.

A layer 2 of conducting material M1 is deposited on a substrate 1 of glass to act as anode at the lower electrode. This conducting material M1 is for example Indium Tin Oxide (ITO) deposited by cathode sputtering in a vacuum.

At least one doped lower organic layer 3 made of organic material O1 doped with acceptors, and therefore p-doped is deposited on this layer 2, for example one and/or the other of the following layers:

100 nm of Spiro-TTB (product supplied by COVION) doped 2% in weight with NDP2 (product supplied by NOVALED);

50 nm of PEDOT-PSS. PEDOT-PSS is a mixture of PEDOT (poly-3,4-ethylene dioxythiophene) and of PSS (polystyrene sulfonate); it is p-doped with acceptors, in a manner known in itself, in particular via the PSS.

To control the doping level of the different organic layers of the diode during fabrication, the method below is used based on a planar conductivity measurement of this layer during deposition. This method gives here a result evaluated in mV per tens of nanometers of thickness deposited (mV/10 nm). For a "host" material with a given dopant and deposition rate (Å/s), the doping level of the layer is proportional to the result obtained.

Figure 2:
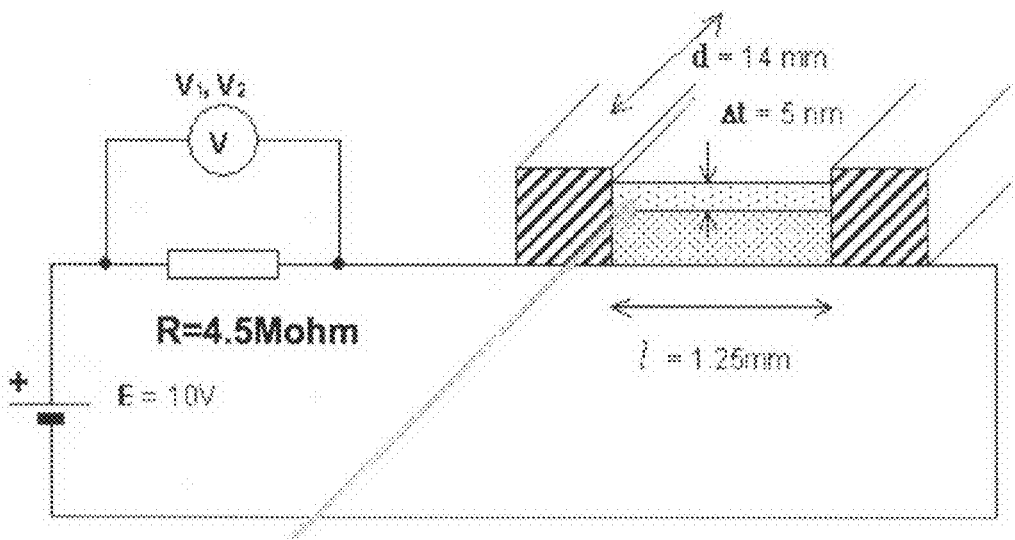
FIG. 2 schematically illustrates an electrical layout enabling the variation of the planar conductivity of a doped organic layer to be evaluated while its thickness increases, therefore during deposition.

To control the doping level of the layer 3 of material O1, the setup of FIG. 2 is for example used where, in the deposition chamber, the material O1 is simultaneously deposited between two metal electrodes (hatched section in the figure) which are separated by a length I=1.25 mm, extend over a distance d=14 mm, and are connected to a resistance measuring device. This device here comprises a DC voltage generator E=10 V and a standard resistor R=4.5 MΩ connected in series. The voltage measured at the terminals of the standard resistor gives the resistance value between the two electrodes. The variation of this voltage versus time (mV/s) brought down to the deposition rate (Å/s) gives a result (expressed in mV/10 nm) considered to be proportional to the doping rate of the layer. Any similar device can be used without departing from the invention.

To ensure the right doping level, the proportion of dopant is preferably adjusted at the time the material O1 is deposited. Doping of around 1% to 2% in weight is generally suitable.

An electron restraining layer 4 made of organic material O4 is deposited on the layer 3 of acceptor-doped organic material O1, in a manner known in itself.

An organic light-emitting layer 5 of material O3 is then deposited on this electron restraining layer 4. This material O3 is generally not doped with donors or acceptors. This material O3 is preferably doped by a fluorescent and/or phosphorescent dopant, as illustrated for example in the article "High-Efficiency Light-Emitting Diodes"—IEEE Journal—op.cit.

A hole restraining layer 6 made of organic material O5 is then deposited on this organic light-emitting layer 5 in a manner known in itself.

A doped upper organic layer 7, made of donor-doped material O2 and therefore n-doped, is then deposited on this hole restraining layer 6. Here, the donor dopant concentration is approximately constant over the whole thickness of this layer. According to an alternative embodiment, the donor dopant concentration is much higher at the interface with the electrode 8 which will coat the latter than in the heart of this material O2. The previously described control of the doping level is performed for the layer 7 of material O2.

A metal layer M2 is deposited on this doped upper organic layer 7 to act as upper electrode 8, here a cathode.

The stack thus obtained then undergoes thermal treatment at 80° C. for 24 hours.

A diode according to the invention is obtained in this way.

A substantial improvement of the diode performances and lifetime are observed due to the thermal treatment according to the invention, which is illustrated by the example below. This improvement expresses the large lowering of the potential barrier between the cathode and the light-emitting organic layer that can be obtained with alkaline earth dopants, in particular calcium, which are easier to implement than alkaline dopants of the prior art. An advantageous reduction of the resistivity of the layer 7 is also obtained.

Example 1

The diode presented in this example presents the same structure as that of the embodiment of the invention that has just been described above.

From bottom to top starting from the substrate 1, this diode presents the following layers:
- metal layer 2 of ITO with a thickness of about 150 nm;
- doped lower organic layer 3: 100 nm of Spiro-TTB (product supplied by COVION) doped 2% in weight with NDP2 (product supplied by NOVALED);
- electron restraining layer 4 called "SPIRO TAD" from COVION, with a thickness of 10 nm;
- light-emitting layer 5 with a thickness of 20 nm able to emit a red-colored radiation. The materials for this layer are provided by COVION: product named in 2004 "TMM-004" doped 20% in weight with a phosphorescent dopant named in 2004 "TERMINAL-004";
- hole restraining layer 6 made of non-doped 4,7-diphenyl-1,10-phenanthroline (Bphen), with a thickness of 10 nm;
- doped upper organic layer 7 made from "Bphen" (supplied by COVION) n-doped with calcium, with a thickness of 50 nm. The doping level is adjusted to obtain a conductivity variation, according to the method described above, of 80 mV/10 nm. This doping level is approximately constant over the whole thickness of the layer;
- metallic layer of aluminium to act as cathode 8, with a thickness of approximately 200 nm, which also acts as encapsulation and protection layer.

The stack obtained then undergoes thermal treatment at 80° C. for 24 hours.

The diode according to example 1 of the invention is obtained in this way.

Figure 3:
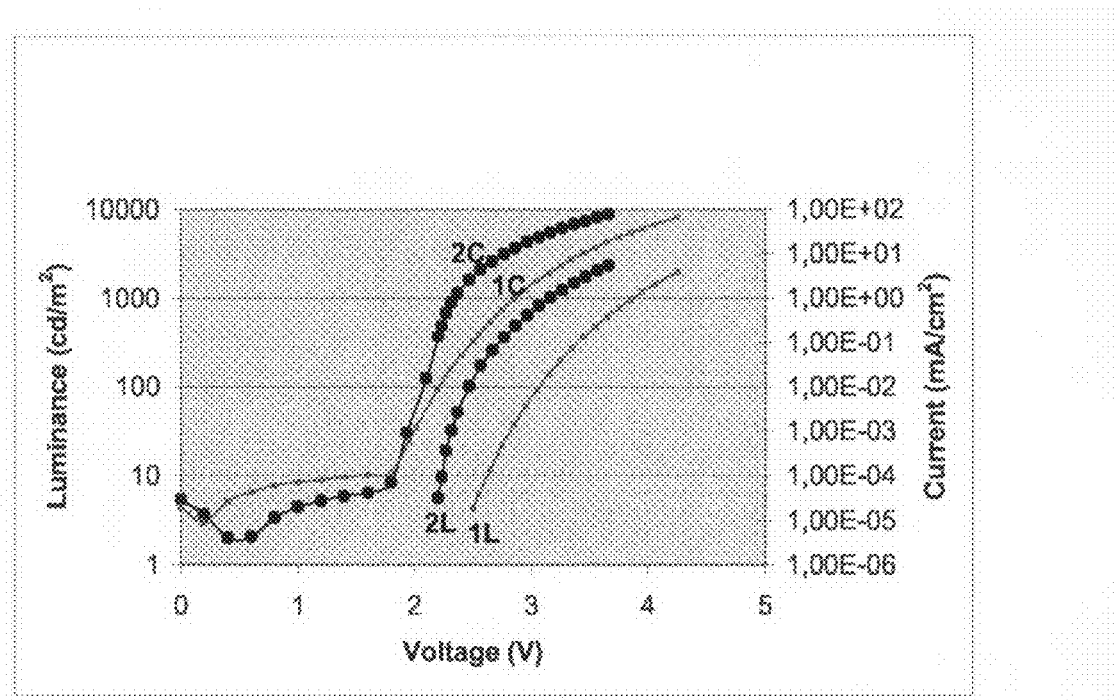
FIG. 3 shows the current-voltage characteristics (curves 1C and 2C which refer to the y-axis on the right—$mA/cm^2$) and the luminance performances (curves 1L and 2L which refer to the y-axis on the left—$cd/m^2$) of a diode according to an example of a diode (curves referenced 2) according to the embodiment of the invention of FIG. 1 in comparison with a diode of the prior art presenting the same structure (curves referenced 1), without subsequent thermal treatment of the diode.
Figure 4:
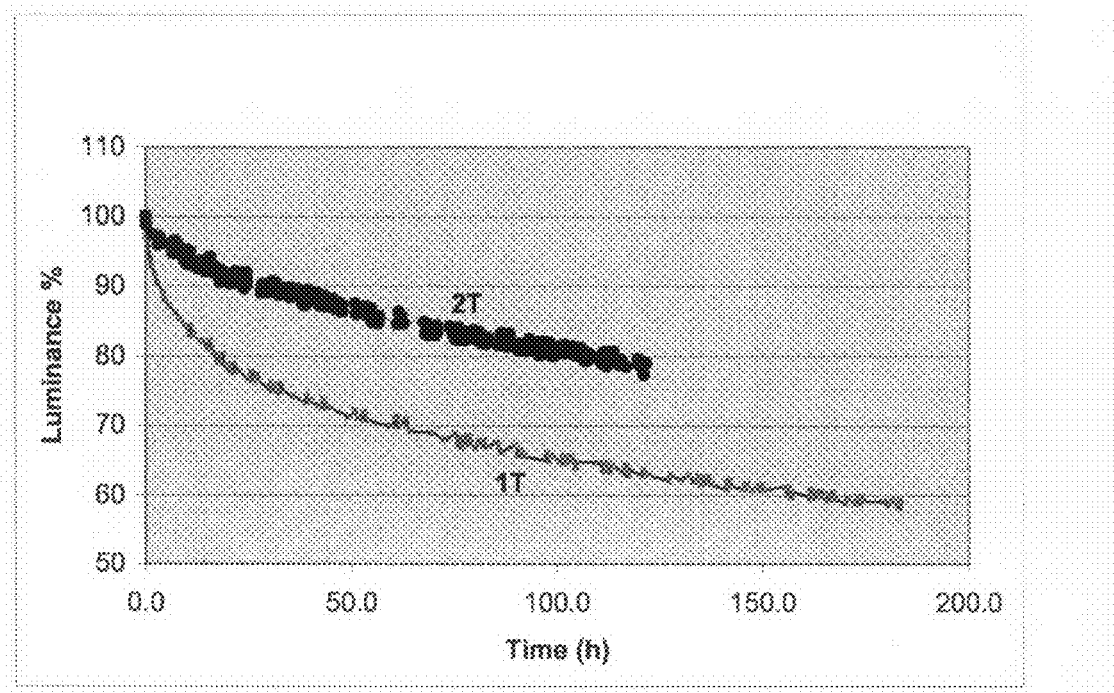
FIG. 4 shows the lifetime, more precisely the variation of the luminance ($cd/m^2$) versus time (hours) of a diode according to an example of a diode (curves referenced 2) according to the embodiment of the invention of FIG. 1 in comparison with a diode of the prior art presenting the same structure (curves referenced 1), without subsequent thermal treatment of the diode; the measurements are made at constant current of 27 $mA/cm^2$; base "100" at the beginning of life corresponds approximately to 800 $cd/m^2$.

The current-voltage characteristics, luminance-voltage characteristics, and luminance-time characteristics of this diode are reported respectively in FIG. 3 (for the first two characteristics) and in FIG. 4, on curves respectively referenced 2C, 2L, and 2T.

Comparative Example 1

For comparative example purposes, a diode identical to that of example 1 was produced, the only difference being that no thermal treatment was performed subsequent to the depositions.

The current-voltage characteristics, luminance-voltage characteristics, and luminance-time characteristics of this diode are reported respectively in FIG. 3 (for the first two characteristics) and in FIG. 4, on curves respectively referenced 1C, 1L, and 1T.

Comparing the results of the diode of example 1 with those of the diode of the comparative example 1, it can be observed that thermal treatment according to the invention enables the supply voltage required to obtain a predetermined current, and therefore a predetermined lighting, can be substantially reduced, as:
- the voltage required to obtain a lighting of 1000 cd/m$^2$ is reduced from 4 V in the comparative example 1 to only 3.1 V in example 1 according to the invention;
- the voltage required to obtain a lighting of 100 cd/m$^2$ is reduced from 3 V in the comparative example 1 to only 2.5 V in example 1 according to the invention.

Equivalent performances are therefore obtained for the diode according to the invention to those which would be obtained with doping of the upper organic layer 7 with an alkaline element, as in the prior art, for example cesium. Moreover, with reference to FIG. 4, it can be seen that the lifetime of the diode is substantially improved by means of the thermal treatment according to the invention.

Example 2 and Comparative Example 2

The object of these examples is to optimize the dopant concentration in the upper organic layer 7 on the one hand for diodes according to the invention which are identical to those of example 1, the only difference being the dopant rate and the duration of the final thermal treatment which is doubled (48 hrs instead of 24 hrs—identical temperature of 80° C.), and on the other hand for diodes that are identical to those of the comparative example 1, the only difference being the dopant rate.

Figure 5:
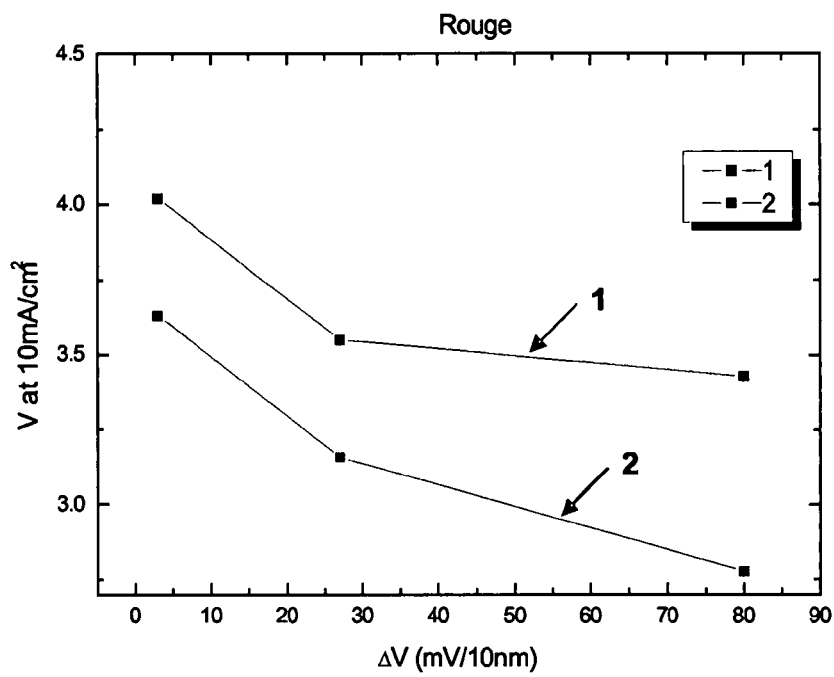
FIGS. 5 and 6 illustrate the variation of the supply voltage necessary to obtain a current of 10 $mA/cm^2$ (FIG. 5) or a red emission of 100 $cd/m^2$ (FIG. 6) in a diode according to the invention with thermal treatment at 80° C. for 48 hrs (curves 2) and in a diode according to the prior art that is identical but without subsequent thermal treatment (curves 1), versus the evaluated doping level, as described further on, by the factor $\Delta V$ expressed in mV/10 nm.
Figure 6:
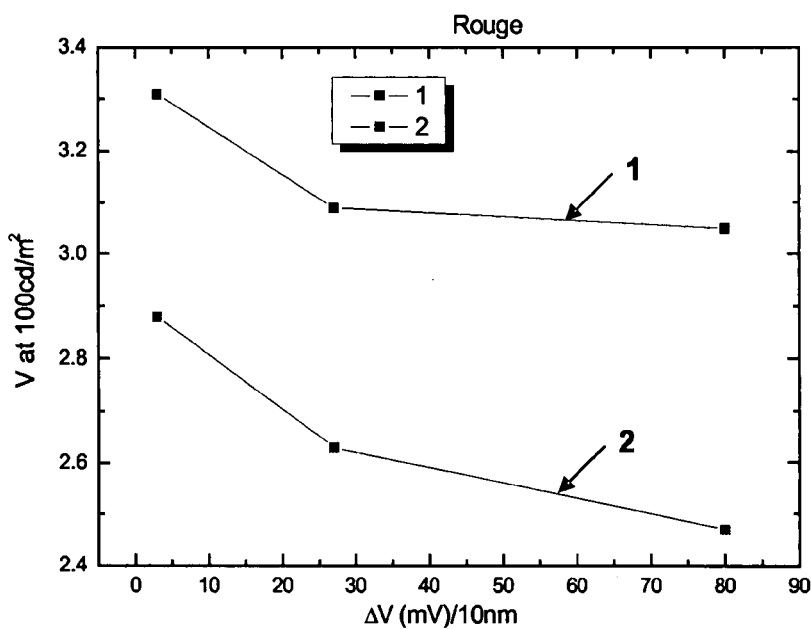

FIGS. 5 and 6 illustrate the variation of the supply voltage required to obtain a current of 10 mA/cm$^2$ (FIG. 5) or a red emission of 100 cd/m$^2$ (FIG. 6) in diodes according to the invention (curves 2) and in these diodes according to the prior art, versus the doping level in the upper organic layer 7, which is evaluated, as described before, by the factor ΔV expressed in mV/10 nm.

It can be observed that a doping level of 80 mV/10 nm gives the best results.

Example 3

The object of these examples is to optimize the temperature of the final thermal treatment for diodes according to the invention which are identical to those of example 1, the only difference being the final thermal treatment which is performed at variable temperature and with a duration which is doubled (48 hrs instead of 24 hrs). The doping level of the upper organic layer 7 is identical to that of example 1 (80 mV/10 nm).

Figure 7:
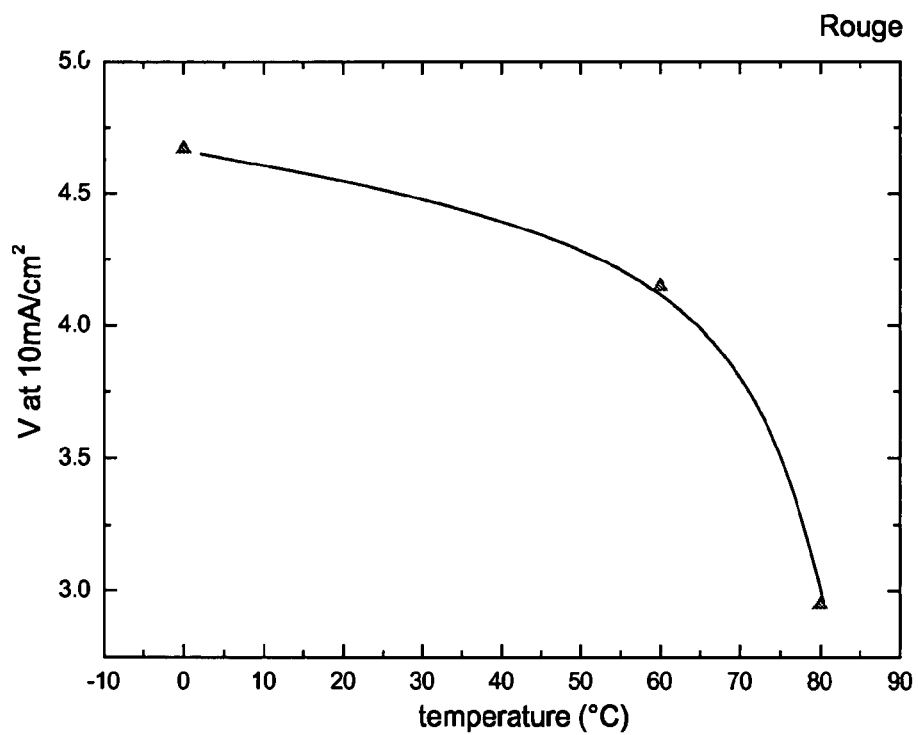
FIGS. 7 and 8 illustrate the variation of the supply voltage necessary to obtain a current of 10 $mA/cm^2$ (FIG. 7) or an emission of 100 $cd/m^2$ (FIG. 8) in a diode that is provided with a light-emitting layer emitting in the red and that is achieved according to the invention with a final thermal treatment of 48 hrs, versus the temperature of said thermal treatment (° C.)
Figure 8:
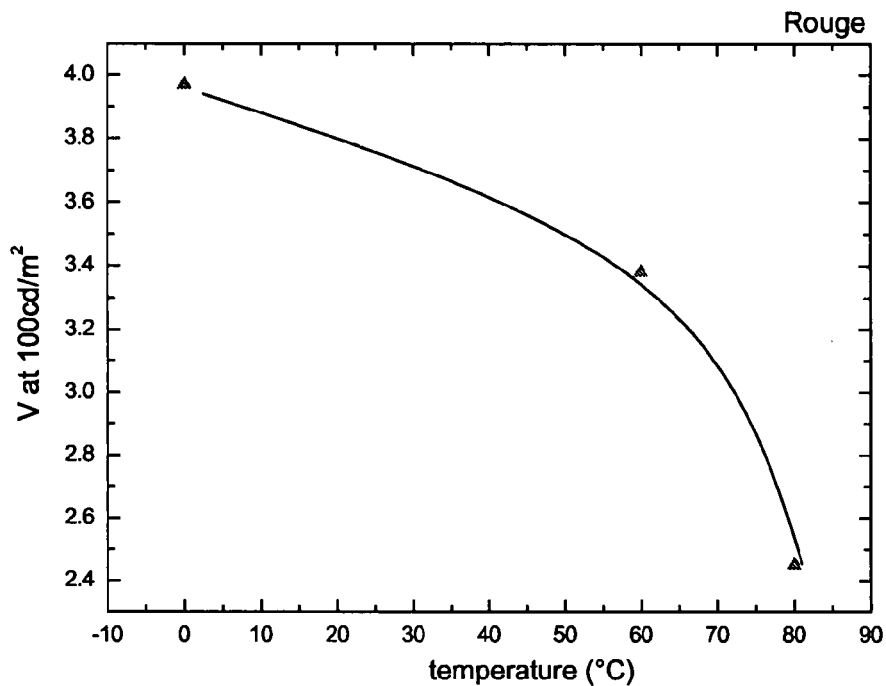

FIGS. 7 and 8 illustrate the variation of the supply voltage required to obtain a current of 10 mA/cm$^2$ (FIG. 7) or an emission of 100 cd/m$^2$ (FIG. 8) in these diodes according to the invention versus the thermal treatment temperature (° C.).

A significant improvement is observed when the thermal treatment temperature is greater than or equal to 60° C.; it is observed that thermal treatment at 80° C. gives the best results.

Example 4

The object of these examples is to optimize the temperature of the final thermal treatment for diodes according to the invention which are identical to those of example 1, the only differences being the final thermal treatment which is performed at variable temperature and with a duration which is doubled (48 hrs instead of 24 hrs) and the material of the light-emitting layer 5 which is adapted here to obtain a green-colored emission. The previously described product TMM 004 is for example taken this time doped at 15% in weight with a product called Ir(ppy)$_3$. The doping level of the upper organic layer 7 is identical to that of example 1 (80 mV/10 nm).

The product Ir(ppy)$_3$ corresponds to the following structural formula:

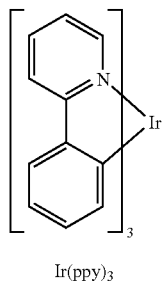

Ir(ppy)$_3$

Figure 9:
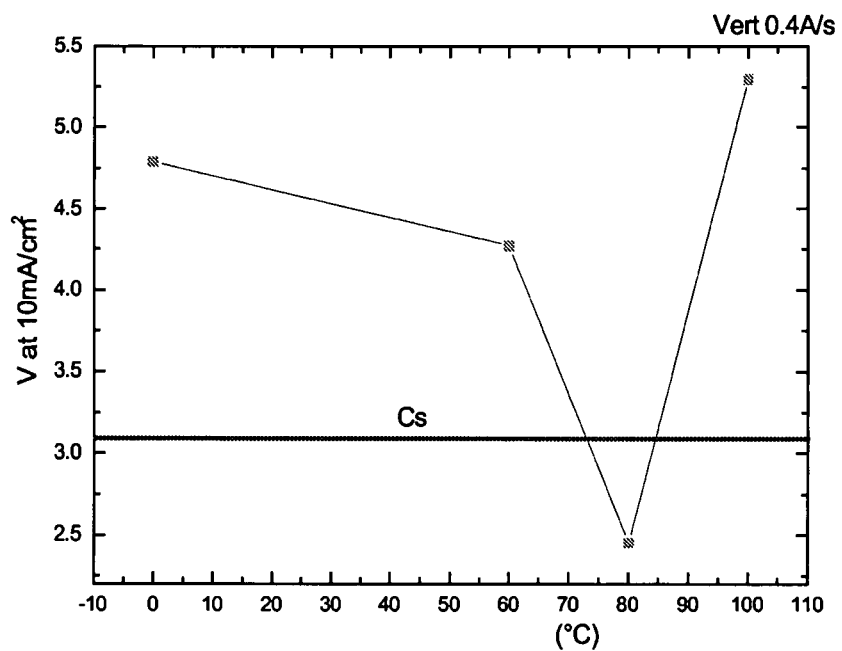
FIGS. 9 and 10 illustrate the variation of the supply voltage necessary to obtain a current of 10 $mA/cm^2$ (FIG. 9) or an emission of 100 $cd/m^2$ (FIG. 10) in a diode that is provided with a light-emitting layer emitting in the green and that is achieved according to the invention with a final thermal treatment of 48 hrs, versus the temperature of said thermal treatment (° C.)
Figure 10:
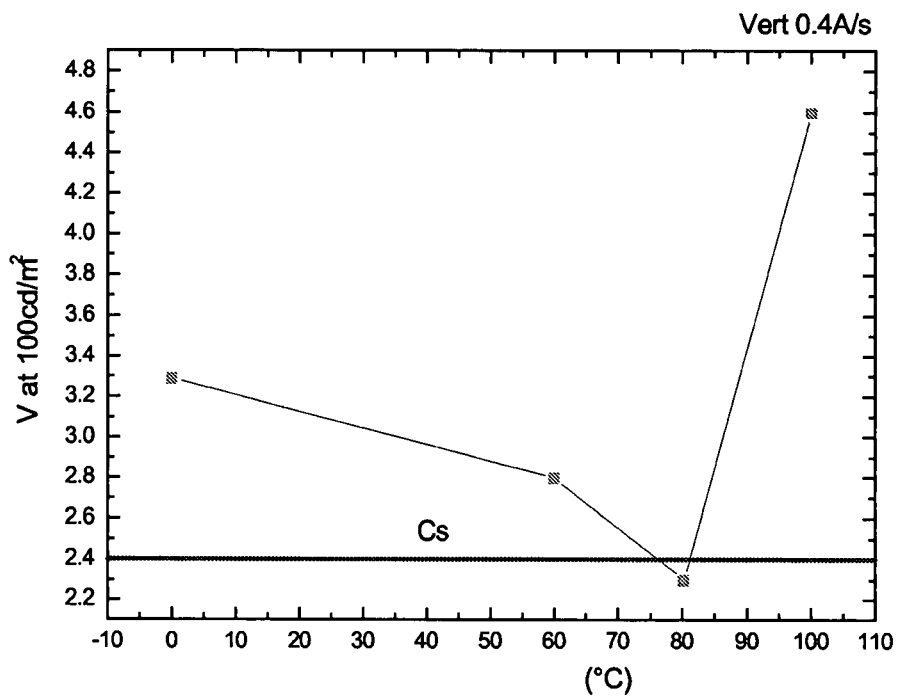

FIGS. 9 and 10 illustrate the variation of the supply voltage required to obtain a current of 10 mA/cm$^2$ (FIG. 9) or an emission of 100 cd/m$^2$ (FIG. 10) in these diodes according to the invention versus the thermal treatment temperature (° C.).

Here again, a significant improvement is observed when the thermal treatment temperature is greater than or equal to 60° C.; it is observed that thermal treatment at 80° C. gives the best results, and that at 90° C., the performances of the diode worsen.

Comparative Example 3

In FIGS. 9 and 10, the horizontal curves in bold lines referenced Cs indicate the performances of a diode that is identical to that of the comparative example 1, the only differences being that the material of the light-emitting layer 5 is identical to that of examples 4 (green emission) and that the dopant of the upper organic layer 7 is cesium (instead of calcium), at a doping level that is optimized and corresponds to a measurement of 15 mV/10 nm (measured under the previously described conditions).

It can therefore be observed that the best diodes of example 4 according to the invention (thermal treatment at 80° C.) have performances that are comparable with conventional diodes of the prior art provided with cesium-doped organic injection and/or transport layers.

Example 5

The object of these examples is to optimize the temperature of the final thermal treatment for diodes according to the invention which are identical to those of example 1, the only differences being the final thermal treatment which is performed at variable temperature and with a duration which is doubled (48 hrs instead of 24 hrs) and the material of the light-emitting layer 5 which is adapted here to obtain a blue-colored emission, and which is for example a material called SEB010 doped 2% in weight with a material called SEB021. The doping level of the upper organic layer 7 is identical to that of example 1 (80 mV/10 nm).

Figure 11:
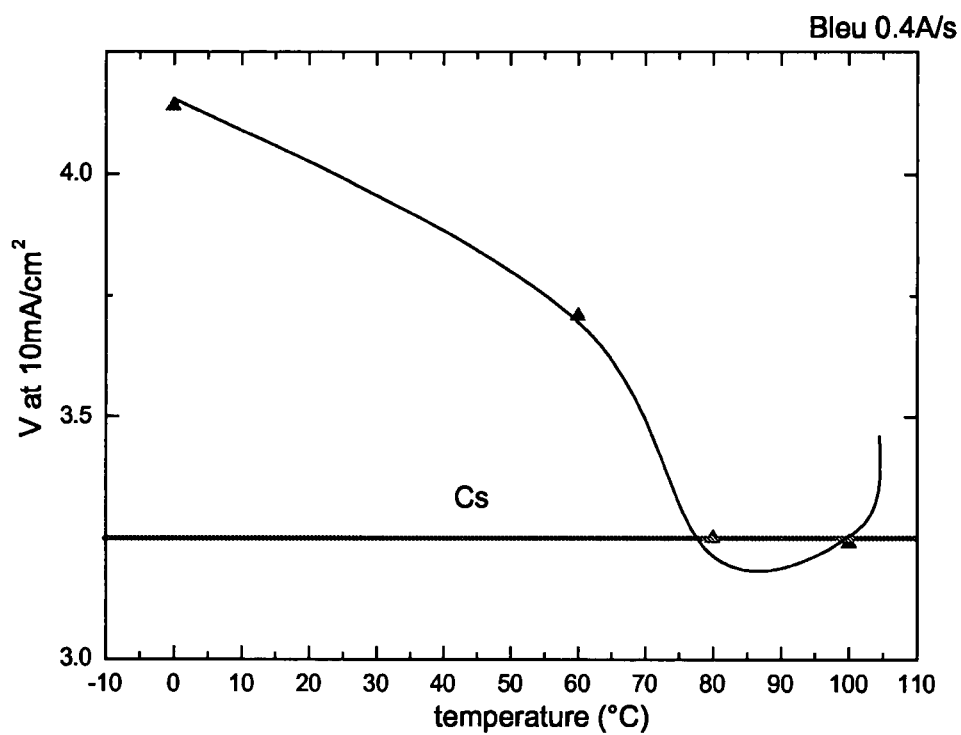
FIGS. 11 and 12 illustrate the variation of the supply voltage necessary to obtain a current of 10 $mA/cm^2$ (FIG. 11) or an emission of 100 $cd/m^2$ (FIG. 12) in a diode that is provided with a light-emitting layer emitting in the blue and that is achieved according to the invention with a final thermal treatment of 48 hrs, versus the temperature of said thermal treatment (° C.)
Figure 12:
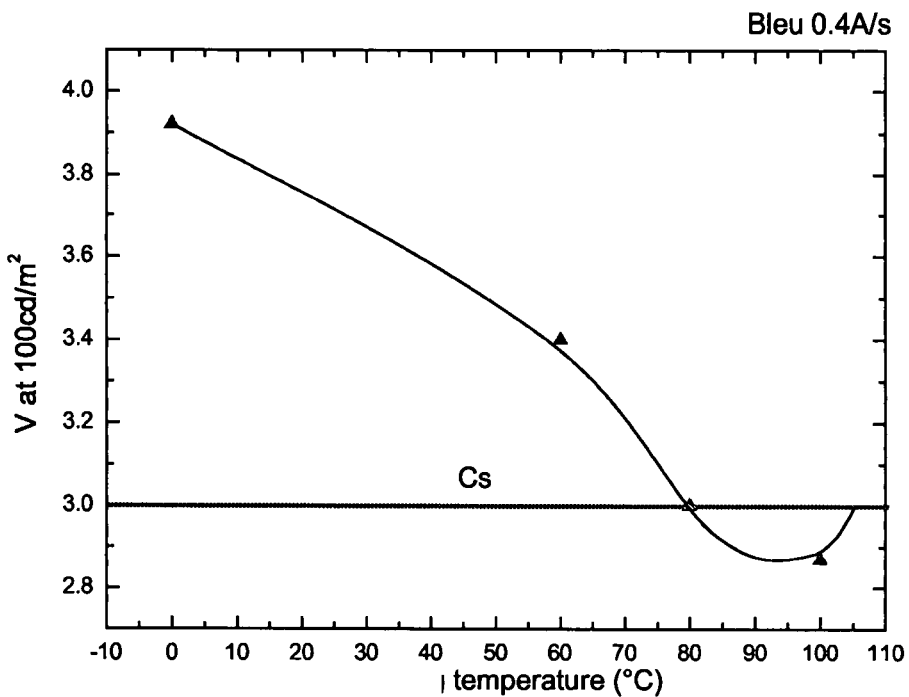
Figure 13:
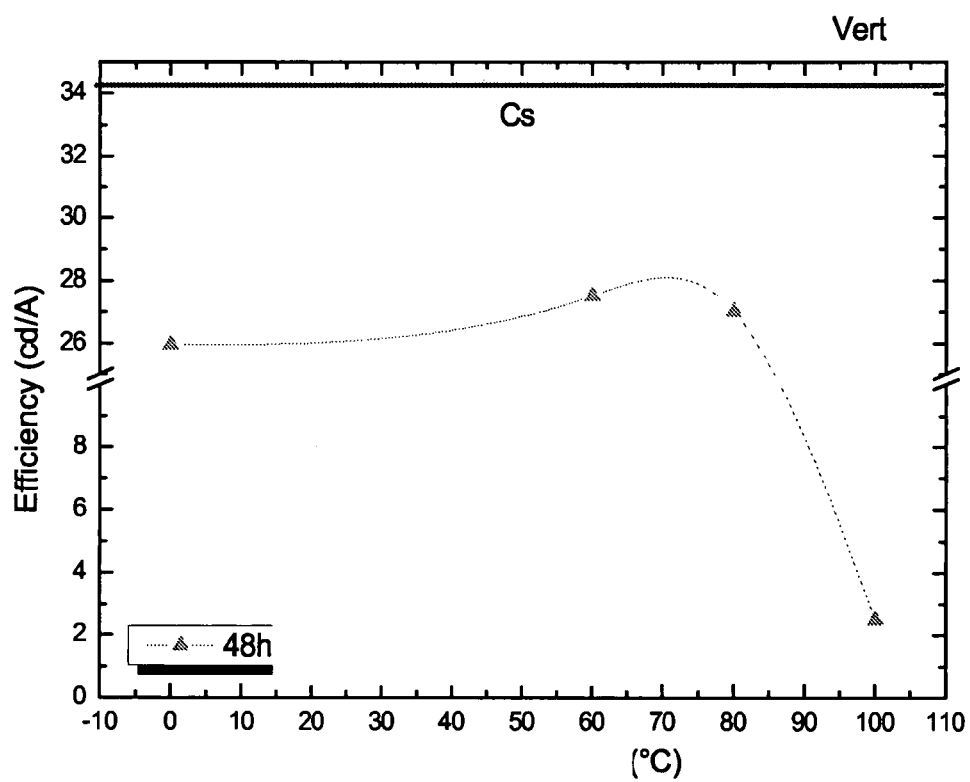
FIG. 13 gives the variation of the lighting efficiency (cd/A) of the diodes emitting in the red that are characterized in FIGS. 7 and 8 versus the temperature of the final thermal treatment of these diodes (° C.).

FIGS. 11 and 12 illustrate the variation of the supply voltage required to obtain a current of 10 mA/cm$^2$ (FIG. 11) or an emission of 100 cd/m$^2$ (FIG. 12) in these diodes according to the invention versus the thermal treatment temperature (° C.).

A significant improvement is observed when the thermal treatment temperature is greater than or equal to 60° C.; it is observed that thermal treatment at 80° C. gives the best results, and that at 100° C., the performances of the diode remain optimal.

Comparative Example 4

In FIGS. 11 and 12, the horizontal curves in bold lines referenced Cs indicate the performances of a diode that is identical to that of the comparative example 1, the only differences being that the material of the light-emitting layer 5 is identical to that of examples 5 (blue emission) and that the dopant of the upper organic layer 7 is cesium (instead of calcium), at a doping level that is optimized and corresponds to a measurement of 15 mV/10 nm (measured under the previously described conditions).

It can therefore be observed that the best diodes of example 5 according to the invention (thermal treatment temperature greater than or equal to 80° C.) have comparable performances with conventional diodes of the prior art provided with cesium-doped organic injection and/or transport layers.

The invention also applies to lighting and image display panels comprising an array of such diodes.

The present invention has been described with reference to a diode comprising both a lower doped organic layer and an upper doped organic layer, where the lower electrode is an anode and the upper electrode is a cathode. It is obvious to the man of the trade that it can apply to other types of diodes without departing from the scope of the claims below, in particular diodes where the lower electrode is a cathode and the upper electrode is an anode.

The invention claimed is:
1. A method for realizing a diode comprising:
providing a substrate with a cathode electrode;
depositing a layer of bathophenanthroline-based organic material doped with calcium in contact with the cathode electrode, the doping level of calcium being higher at the interface of the bathophenanthroline-based organic material and the cathode electrode than it is at the center of the layer of bathophenanthroline-based organic material;
depositing a light-emitting organic layer on the bathophenanthroline-based organic material;
depositing an anode electrode on the light-emitting organic layer; and
after depositing the electrodes and layers, performing a thermal treatment at a temperature greater than or equal to 80° C.
2. The method according to claim 1, wherein the temperature of said thermal treatment is equal to 80° C.

3. The method according to claim 1, wherein the duration of said thermal treatment is greater than or equal to 1 hr.

4. The method according to claim 1, wherein the bathophenanthroline-based organic material doped with calcium has a thickness greater than or equal to 5 nm.

5. The method according to claim 1, further comprising intercalating an organic hole restraining layer between the layer of bathophenanthroline-based organic material and the light-emitting layer, wherein the organic hole restraining layer is made of bathophenanthroline-based organic material that is not doped by the donor, and has a thickness greater than or equal to 5 nm.

6. The method according to claim 1, wherein the duration of said thermal treatment is 24 hrs to 48 hrs.

7. The method according to claim 1, wherein the temperature of said thermal treatment is equal to 100° C.

8. A method for realizing a diode comprising:
providing a substrate with an anode electrode;
depositing a light-emitting organic layer on the anode electrode;
depositing a layer of bathophenanthroline-based organic material doped with calcium on the light-emitting organic layer;
depositing a cathode electrode in contact with the bathophenanthroline-based organic material, the doping level of calcium being higher at the interface of the bathophenanthroline-based organic material and the cathode electrode than it is at the center of the layer of bathophenanthroline-based organic material; and
after depositing the electrodes and layers, performing a thermal treatment at a temperature greater than or equal to 80° C.

9. The method according to claim 8, wherein the temperature of said thermal treatment is equal to 80° C.

10. The method according to claim 8, wherein the duration of said thermal treatment is greater than or equal to 1 hr.

11. The method according to claim 8, wherein the bathophenanthroline-based organic material doped with calcium has a thickness greater than or equal to 5 nm.

12. The method according to claim 8, further comprising intercalating an organic hole restraining layer between the layer bathophenanthroline-based organic material and the light-emitting layer, wherein the organic hole restraining layer is made of bathophenanthroline-based organic material that is not doped by the donor, and has a thickness greater than or equal to 5 nm.

13. A method for realizing a diode comprising:
providing a substrate with a cathode electrode;
depositing only a single layer of bathophenanthroline-based organic material on the cathode electrode, the single layer of bathophenanthroline-based organic material being in contact with the cathode electrode, the bathophenanthroline-based organic material being doped with calcium, the doping level of calcium being substantially uniform throughout the single layer of bathophenanthroline-based organic material;
depositing a light-emitting organic layer on the single layer of bathophenanthroline-based organic material;
depositing an anode electrode on the light-emitting organic layer; and
after depositing the electrodes and layers, performing a thermal treatment at a temperature greater than or equal to 80° C.

14. A method for realizing a diode comprising:
providing a substrate with an anode electrode;
depositing a light-emitting organic layer on the anode electrode;
depositing only a single layer of bathophenanthroline-based organic material on the light-emitting organic layer, the bathophenanthroline-based organic material being doped with calcium, the doping level of calcium being substantially uniform throughout the single layer of bathophenanthroline-based organic material;
depositing a cathode electrode in contact with the single layer of bathophenanthroline-based organic material; and
after depositing the electrodes and layers, performing a thermal treatment at a temperature greater than or equal to 80° C.

* * * * *